(12) United States Patent
Ho et al.

(10) Patent No.: US 7,804,729 B2
(45) Date of Patent: Sep. 28, 2010

(54) TEMPERATURE COMPENSATION CIRCUIT AND METHOD FOR SENSING MEMORY

(75) Inventors: Wen-Chiao Ho, Tainan County (TW); Ji-Yu Hung, Miaoli County (TW); Chun-Hsiung Hung, Hsinchu (TW); Shuo-Nan Hung, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 134 days.

(21) Appl. No.: 12/271,022

(22) Filed: Nov. 14, 2008

(65) Prior Publication Data
US 2010/0124136 A1    May 20, 2010

(51) Int. Cl.
*G11C 7/04* (2006.01)
(52) U.S. Cl. .................. 365/211; 365/212; 365/189.07; 365/189.11
(58) Field of Classification Search .................. 365/211, 365/212; 327/512
See application file for complete search history.

(56) References Cited
U.S. PATENT DOCUMENTS
6,529,421 B1 * 3/2003 Marr et al. ............. 365/189.09

\* cited by examiner

*Primary Examiner*—Tan T. Nguyen
(74) *Attorney, Agent, or Firm*—Thomas, Kayden, Horstemeyer & Risley

(57) ABSTRACT

A temperature compensation circuit includes a voltage generator, a comparator and an emulation cell array. The voltage generator provides a predetermined voltage and a reference voltage. The comparator has a first terminal for receiving the predetermined voltage, and a second terminal for receiving the reference voltage. The emulation cell array is coupled to the first terminal of the comparator. When a voltage of the first terminal of the comparator is discharged, via the emulation cell array, to be lower than the reference voltage, the comparator outputs a read timing control signal to control a sense amplifier to perform a sensing operation.

11 Claims, 4 Drawing Sheets

TEMPERATURE COMPENSATION CIRCUIT AND METHOD FOR SENSING MEMORY

BACKGROUND OF THE INVENTION

1. Field of the Invention

The invention relates in general to a temperature compensation circuit and a method for sensing memory, and more particularly to a temperature compensation circuit and method capable of decreasing the temperature influence.

2. Description of the Related Art

FIG. 1 (Prior Art) is a schematic illustration showing a conventional memory 100. The memory 100 includes a plurality of bit lines BL1 to BLm, a plurality of drain select switches, a plurality of memory cell strings and a plurality of source select switches. For example, the bit line BL1 corresponds to a drain select switch MD, memory cells 200 to 231 and a source select switch MS. The drain select switch MD is controlled by a control signal DS, the memory cells 200 to 231 are respectively controlled by word line signals WL0 to WL31, and the source select switch MS is controlled by a control signal SS.

FIG. 2 (Prior Art) shows a read timing chart of the conventional memory. At time T1, a read compare voltage, such as 3V, is applied to a word line WL_sel corresponding to a to-be-read target memory cell so that the data stored in the target memory cell can be determined. Meanwhile, a read pass voltage, such as 5V, is applied to a word line WL_unsel corresponding to other memory cells. At time T2, the control signal DS turns on the drain select switch MD to charge the bit line WL0 to about 0.7V and to make the voltage of the bit line WL0 become floating.

At time T3, the control signal SS controls the source select switch MS to turn on. If the target memory cell has a low threshold voltage, a discharge path is generated to lower the voltage of the bit line BL1. On the contrary, if the target memory cell has a high threshold voltage, the voltage of the bit line BL1 is held. So, at time T4, the voltage of the bit line BL1 is sensed. If the voltage of the bit line BL1 is still held at the voltage of 240, the target memory cell has the high threshold voltage; and if the voltage of the bit line BL1 is lowered to the voltage of 242, the target memory cell has the low threshold voltage. Consequently, it is possible to judge whether the data stored in the target memory cell is 0 or 1.

However, the memory cell current is associated with the temperature. With the change of the temperature, the discharging current I may be increased so that the voltage change of the bit line BL1 is increased. For example, when the target memory cell has the high threshold voltage, the voltage of the bit line BL1 is slightly lowered to the voltage of 244. When the target memory cell has the low threshold voltage, the voltage of the bit line BL1 is further lowered to the voltage of 246. Consequently, different bit line voltages at the sensing time T4 may cause the read window loss. FIG. 3 (Prior Art) is a graph showing a bit line voltage of a target memory cell of the conventional memory versus time. As shown in FIG. 3, the read window loss ΔV is caused if the sensing operation is performed at the same time T4 but different corresponding temperatures t1 and t2.

SUMMARY OF THE INVENTION

The invention is directed to a temperature compensation circuit and a method for sensing a memory, wherein an emulation cell array is employed to emulate the change of a memory cell current of a memory cell array associated with the temperature so that the temperature influence is reduced and the read window is improved.

According to a first aspect of the present invention, a temperature compensation circuit including a voltage generator, a comparator and an emulation cell array is provided. The voltage generator provides a predetermined voltage and a reference voltage. The comparator has a first terminal for receiving the predetermined voltage, and a second terminal for receiving the reference voltage. The emulation cell array is coupled to the first terminal of the comparator. When a voltage of the first terminal of the comparator is discharged, via the emulation cell array, to be lower than the reference voltage, the comparator outputs a read timing control signal to control a sense amplifier to perform a sensing operation.

According to a second aspect of the present invention, a temperature compensation method applied to a temperature compensation circuit is provided. The temperature compensation circuit includes a voltage generator a comparator and an emulation cell array. The method includes the following steps. The voltage generator provides a reference voltage to a second terminal of the comparator. The voltage generator charges a first terminal of the comparator to a predetermined voltage. The first terminal of the comparator is discharged via the emulation cell array. When a voltage of the first terminal of the comparator is lower than the reference voltage, the comparator outputs a read timing control signal to control a sense amplifier to perform a sensing operation.

The invention will become apparent from the following detailed description of the preferred but non-limiting embodiments. The following description is made with reference to the accompanying drawings.

DETAILED DESCRIPTION OF THE INVENTION

The invention provides a temperature compensation circuit and method for sensing a memory, wherein an emulation cell array is employed to emulate the change of a memory cell current of a memory cell array associated with the temperature and to control the timing of a sense amplifier for sensing the memory cell array so that the temperature influence is reduced and the read window is improved.

Figure 1:
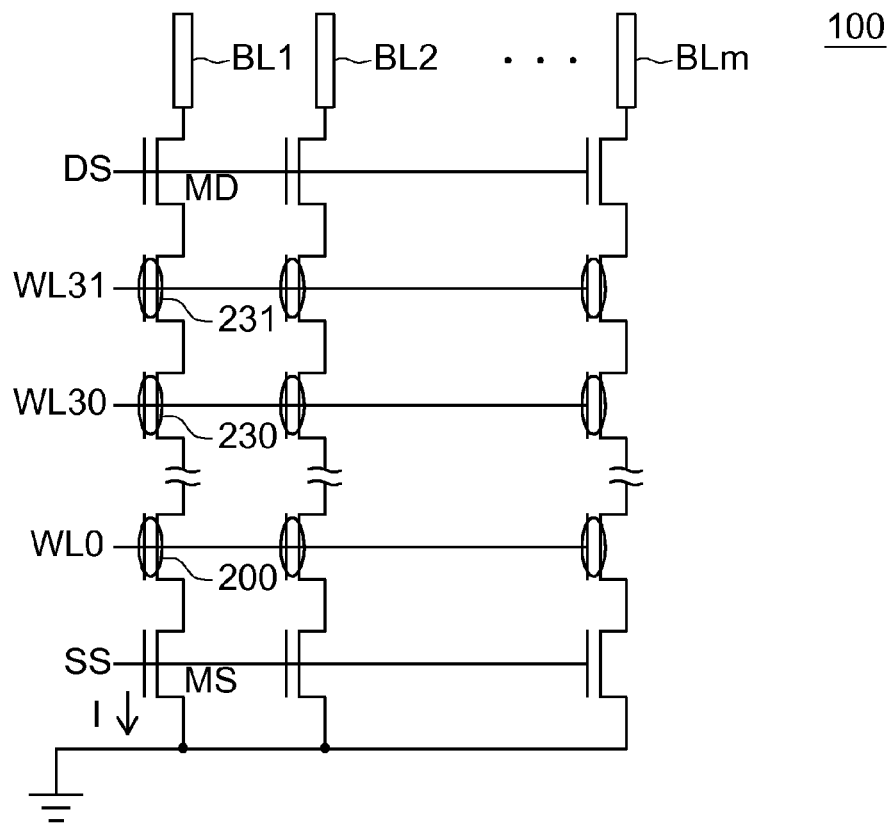
FIG. 1 (Prior Art) is a schematic illustration showing a conventional memory.
Figure 2:
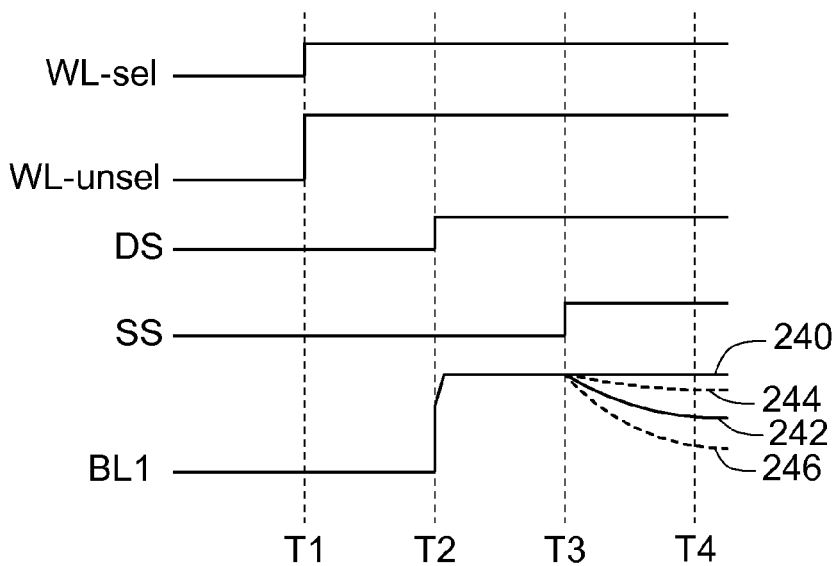
FIG. 2 (Prior Art) shows a read timing chart of the conventional memory.
Figure 3:
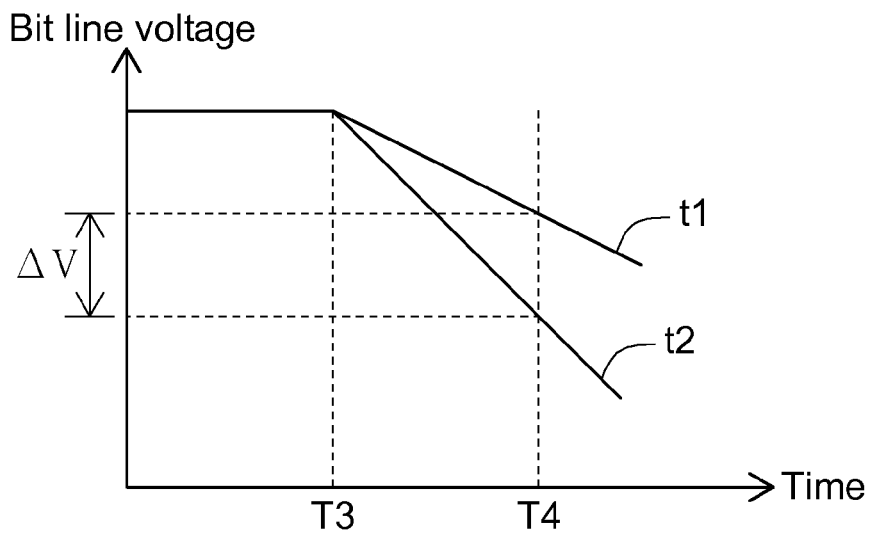
FIG. 3 (Prior Art) is a graph showing a bit line voltage of a target memory cell of the conventional memory versus time.
Figure 4:
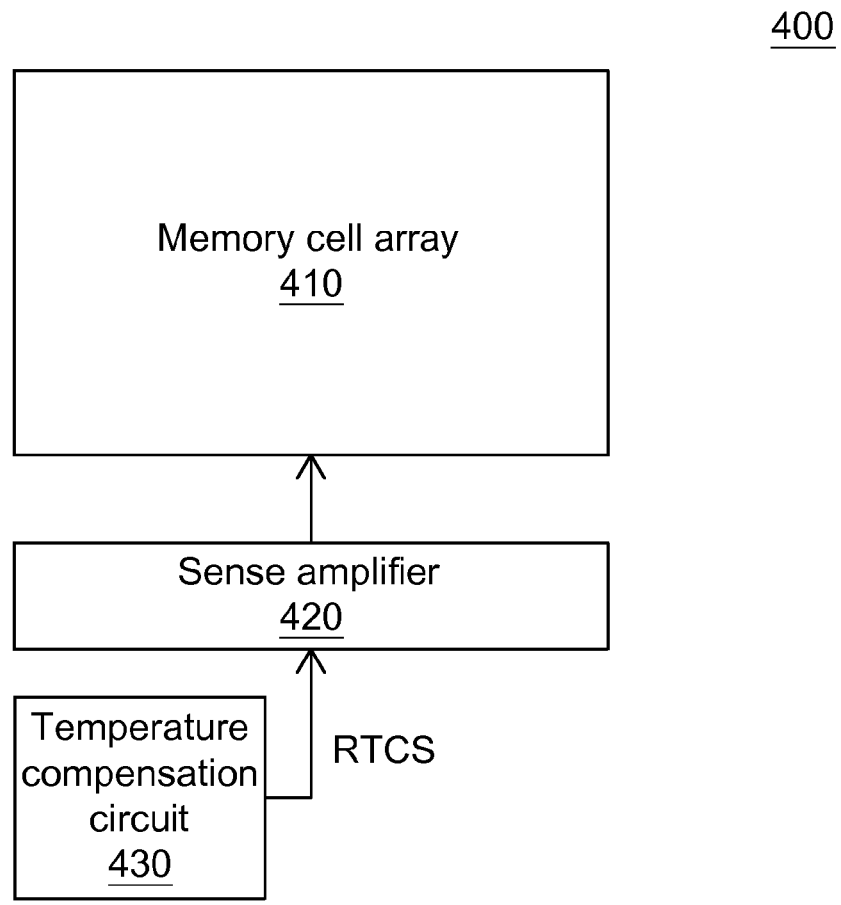
FIG. 4 is a schematic illustration showing a memory according to a preferred embodiment of the invention.
Figure 5:
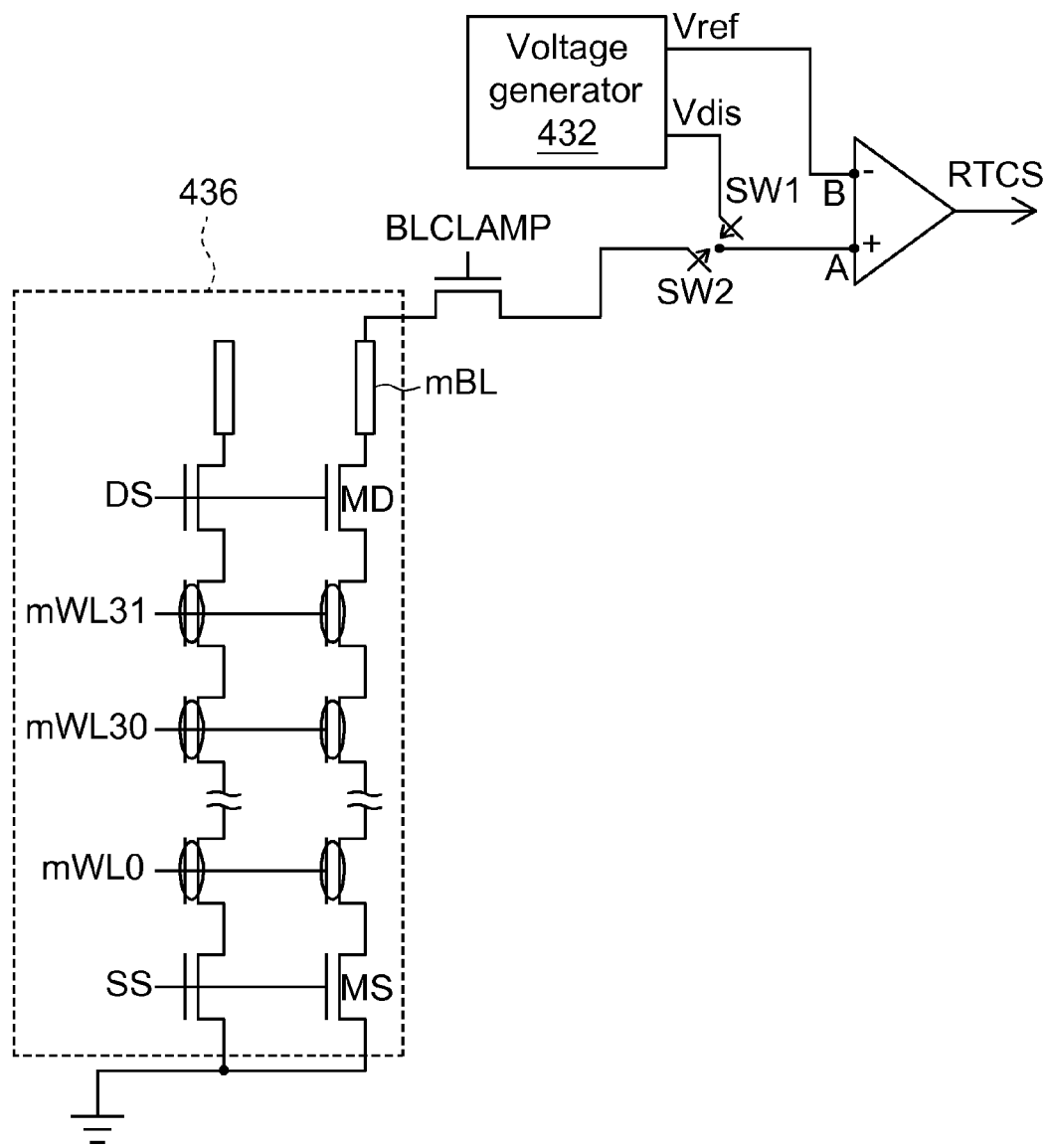
FIG. 5 is a circuit diagram showing a temperature compensation circuit according to the preferred embodiment of the invention.

FIG. 4 is a schematic illustration showing a memory 400 according to a preferred embodiment of the invention. The memory 400, such as a non-volatile memory or even a NAND type memory, includes a memory cell array 410, a sense amplifier 420 and a temperature compensation circuit 430. FIG. 5 is a circuit diagram showing the temperature compensation circuit 430 according to the preferred embodiment of the invention. Referring to FIG. 5, the temperature compensation circuit 430 includes a voltage generator 432, a comparator 434, a first switch SW1, a second switch SW2 and an emulation cell array 436.

In the temperature compensation circuit 430, the first switch SW1 is coupled to and between the voltage generator 432 and a first terminal (node A) of the comparator 434, the second switch SW2 is coupled to and between the first terminal (node A) of the comparator 434 and the emulation cell array 436. The emulation cell array 436 is independent from the memory cell array 410 or may be integrated in the memory cell array 410. The emulation cell array 436 includes a drain select switch MD, an emulation cell string and a source select switch MS, which are connected in series.

In the temperature compensation circuit 430, the voltage generator 432 provides a reference voltage Vref to a second terminal (node B) of the comparator 434. Then, when the drain select switch MD and the source select switch MS are not turned on, the first switch SW1 and the second switch SW2 are turned on, and the voltage generator 432 charges the first terminal (node A) of the comparator 434 to a predetermined voltage Vdis. The predetermined voltage Vdis is a constant voltage (e.g., 2V), which does not fluctuate as the temperature is changed.

Because the emulation cell array 436 is substantially for emulating the memory cell array 410, the load of the bit line mBL of the emulation cell array 436 is proportional to the load of the bit line BL of the memory cell array 410. In addition, both the cell currents thereof have the same change generated as the temperature is changed. According to $$I = \frac{dQ}{dt} = C\frac{dV}{dt},$$

if the load of the bit line mBL is 10% that of the bit line BL, and the memory cell array need 0.1V bit line voltage difference for sensing, that means, the reference voltage Vref is equal to (Vdis−1) V. If the load of the bit line mBL is 50% that of the bit line BL, the reference voltage Vref is equal to (Vdis−0.2) V. That is, the difference voltage between the predetermined voltage Vdis and the reference voltage Vref is associated with a ratio of the load of the emulation cell array 436 to the load of the memory cell array 410.

Thereafter, the drain select switch MD and the source select switch MS are turned on, and the first switch SW1 is turned off so that the first terminal (node A) of the comparator 434 is discharged via a discharge path formed by the drain select switch MD, the emulation cell string and the source select switch MS. When the voltage of the first terminal (node A) of the comparator 434 is lower than the reference voltage Vref of the node B, the comparator 434 outputs a read timing control signal RTCS to control the sense amplifier 420 to sense the memory cell array 410.

Figure 6:
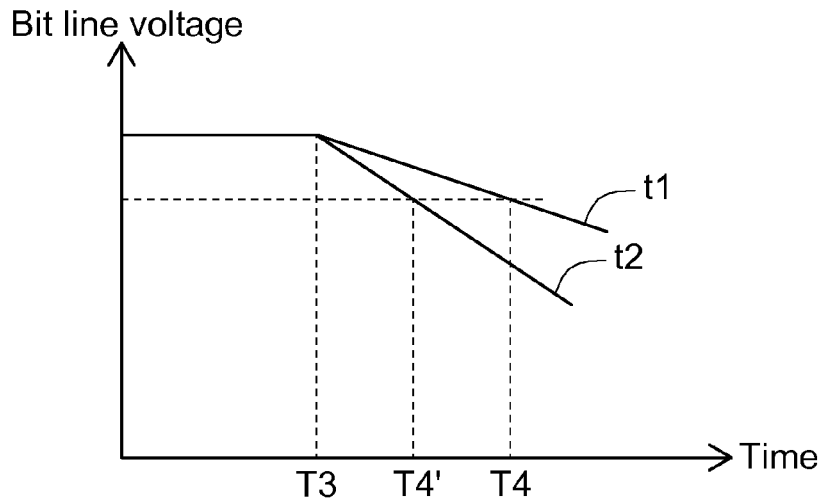
FIG. 6 is a graph showing a bit line voltage of a target memory cell according to the preferred embodiment of the invention versus time.

In the temperature compensation circuit 430, the emulation cell array 436 emulates the memory cell array 410. So, both the cell currents thereof have the same change generated as the temperature is changed. If the temperature change lowers the cell current, then the time, during which the voltage of the node A is discharged from the predetermined voltage Vdis to the reference voltage Vref, is lengthened. That is, the comparator 434 outputs the read timing control signal RTCS more slowly to control the sense amplifier 420 to perform the sensing operation. On the contrary, if the temperature change increases the cell current, the voltage of the node A is discharged quicker, and the comparator 434 outputs the read timing control signal RTCS earlier. FIG. 6 is a graph showing a bit line voltage of a target memory cell according to the preferred embodiment of the invention versus time. As shown in FIG. 6, the sensing operations are performed at different temperatures t1 and t2 and in different times T4 and T4'. Consequently, the loss of the read window is not caused.

Figure 7:
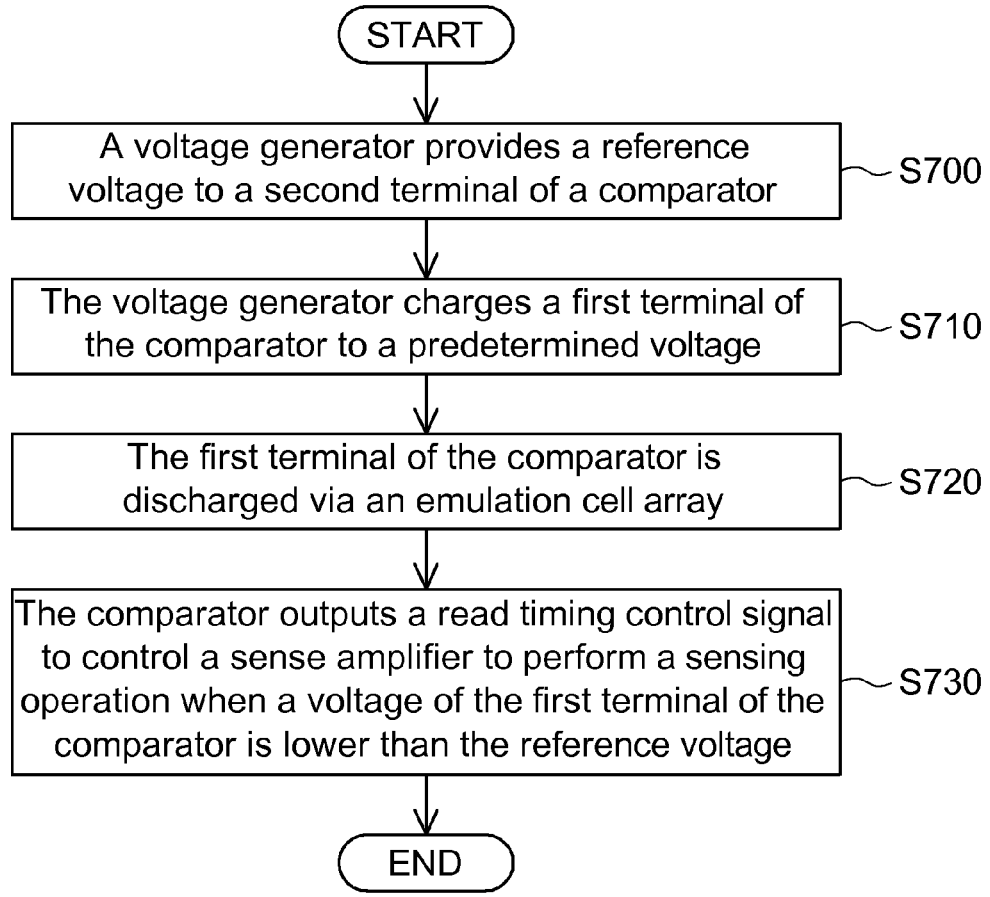
FIG. 7 is a flow chart showing a temperature compensation method for sensing a memory according to the preferred embodiment of the invention.

The invention also provides a temperature compensation method applied to a temperature compensation circuit. The temperature compensation circuit includes a voltage generator, a comparator and an emulation cell array. FIG. 7 is a flow chart showing a temperature compensation method for sensing a memory according to the preferred embodiment of the invention. In step S700, the voltage generator provides a reference voltage to a second terminal of the comparator. In step S710, the voltage generator charges a first terminal of the comparator to a predetermined voltage. In step S720, the first terminal of the comparator is discharged via the emulation cell array. In step S730, the comparator outputs a read timing control signal to control a sense amplifier to perform a sensing operation when the voltage of the first terminal of the comparator is lower than the reference voltage.

The operation principle of the temperature compensation method has been disclosed in the description corresponding to the memory 400, so detailed descriptions thereof will be omitted.

In the temperature compensation circuit and the temperature compensation method according to the embodiment of the invention, the emulation cell array is employed to emulate the change of the memory cell current of the memory cell array associated with the temperature and to control the sense amplifier to perform the sensing operations on the memory cell array at different temperatures and different timings. Consequently, it is possible to reduce the influence of the temperature on the cell current and to improve the read window of the memory.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A temperature compensation circuit, comprising:
   a voltage generator for providing a predetermined voltage and a reference voltage;
   a comparator having a first terminal for receiving the predetermined voltage, and a second terminal for receiving the reference voltage; and
   an emulation cell array coupled to the first terminal of the comparator,
   wherein when a voltage of the first terminal of the comparator is discharged, via the emulation cell array, to be lower than the reference voltage, the comparator outputs a read timing control signal to control a sense amplifier to perform a sensing operation.

2. The temperature compensation circuit according to claim 1, wherein the predetermined voltage is a constant voltage, which does not fluctuate as a temperature of the temperature compensation circuit is changed.

3. The temperature compensation circuit according to claim 2, wherein the comparator outputs the read timing control signal to control the sense amplifier to read a memory cell array, and a difference voltage between the predetermined voltage and the reference voltage is associated with a ratio of a load of the emulation cell array to a load of the memory cell array.

4. The temperature compensation circuit according to claim 3, wherein the emulation cell array is independent from the memory cell array.

5. The temperature compensation circuit according to claim 3, wherein the emulation cell array is integrated in the memory cell array.

6. The temperature compensation circuit according to claim 1, wherein:
  the emulation cell array comprises a drain select switch, an emulation cell string and a source select switch, which are connected in series;
  when the drain select switch and the source select switch are turned off, the first terminal of the comparator is charged to the predetermined voltage; and
  the drain select switch and the source select switch are then turned on so that the first terminal of the comparator is discharged via the drain select switch, the emulation cell string and the source select switch.

7. The temperature compensation circuit according to claim 1, further comprising a first switch and a second switch, wherein the first switch is coupled to and between the voltage generator and the first terminal of the comparator, and the second switch is coupled to and between the first terminal of the comparator and the emulation cell array.

8. A temperature compensation method for sensing a memory, the method being applied to a temperature compensation circuit, which comprises a voltage generator, a comparator and an emulation cell array, the method comprising the steps of:
  providing, by the voltage generator, a reference voltage to a second terminal of the comparator;
  charging, by the voltage generator, a first terminal of the comparator to a predetermined voltage;
  discharging the first terminal of the comparator via the emulation cell array; and
  outputting, by the comparator, a read timing control signal to control a sense amplifier to perform a sensing operation when a voltage of the first terminal of the comparator is lower than the reference voltage.

9. The method according to claim 8, wherein the predetermined voltage is a constant voltage, which does not fluctuate as a temperature is changed.

10. The method according to claim 9, wherein the comparator outputs the read timing control signal to control the sense amplifier to read a memory cell array, and a difference voltage between the predetermined voltage and the reference voltage is associated with a ratio of a load of the emulation cell array to a load of the memory cell array.

11. The method according to claim 8, wherein the emulation cell array comprises a drain select switch, an emulation cell string and a source select switch, which are connected in series, and the method further comprises the steps of:
  charging the first terminal of the comparator to the predetermined voltage when the drain select switch and the source select switch are turned off; and
  turning on the drain select switch and the source select switch such that the first terminal of the comparator is discharged via the drain select switch, the emulation cell string and the source select switch.

* * * * *